United States Patent [19]

Tseng

[11] Patent Number: 5,731,130
[45] Date of Patent: Mar. 24, 1998

[54] METHOD FOR FABRICATING STACKED CAPACITORS ON DYNAMIC RANDOM ACCESS MEMORY CELLS

[75] Inventor: Horng-Huei Tseng, Hsinchu, Taiwan

[73] Assignee: Vanguard International Semiconductor Corporation, Hsin-Chu, Taiwan

[21] Appl. No.: 747,500

[22] Filed: Nov. 12, 1996

[51] Int. Cl.$^6$ .................. B03C 5/00; H01L 21/70
[52] U.S. Cl. .................. 430/316; 430/320; 430/323; 438/396; 438/948
[58] Field of Search .................. 430/316, 320, 430/323; 438/396, 949, 253, 948

[56] References Cited

U.S. PATENT DOCUMENTS

| 5,332,685 | 7/1994 | Park et al. | 437/52 |
| 5,364,813 | 11/1994 | Koh | 437/52 |
| 5,386,382 | 1/1995 | Ahn | 365/174 |
| 5,399,518 | 3/1995 | Sim et al. | 437/52 |
| 5,459,095 | 10/1995 | Huang et al. | 437/52 |
| 5,620,918 | 4/1997 | Kondoh | 438/396 |

*Primary Examiner*—Janet C. Baxter
*Assistant Examiner*—Rosemary Ashton
*Attorney, Agent, or Firm*—George O. Saile; Stephen B. Ackerman

[57] ABSTRACT

A method for manufacturing an array of stacked capacitors with increased capacitance for DRAM devices was achieved. The invention utilizes two photoresist masking steps and a series of self-aligning etch back steps to form a very high density array of bottom capacitor (node) electrodes. The method involves depositing and planarizing an insulating layer over the DRAM cell areas in which node contact openings (first photoresist mask) are etched to the node contact areas of the FETs. A polysilicon layer is deposited, filling the node contact openings, and patterned (second photoresist mask) to define the outer perimeters of bottom electrodes and the polysilicon layer is recessed by partially plasma etching. The second patterned photoresist mask is then laterally recessed by ashing in $O_2$ to expose the polysilicon. A second anisotropic etch is used to form a bottom electrode having a vertical center portion and a wider base area. A conformal insulating layer is deposited and etched back to form sidewall spacers followed by a polysilicon deposition and etch back to form vertical portions on the electrode. The capacitors are then completed by removing (etching) the spacer and portions of the planar underlying layer and forming an interelectrode dielectric on the bottom electrodes and patterning another polysilicon layer to form the top electrodes.

22 Claims, 6 Drawing Sheets

METHOD FOR FABRICATING STACKED CAPACITORS ON DYNAMIC RANDOM ACCESS MEMORY CELLS

BACKGROUND OF THE INVENTION

(1) Field of the Invention

This invention relates to an integrated circuit semiconductor device, and more particularly, to a method for fabricating an array of stacked capacitors for increased capacitance for Dynamic Random Access Memory (DRAM) circuits.

(2) Description of the Prior Art

In recent years there has been a dramatic increase in the integrated circuit density on semiconductor substrates and the semiconductor chips formed therefrom. The increase in circuit density has resulted from the down-sizing of the individual semiconductor devices and the resulting increase in device packing density. This reduction in device size is a result of advances in high resolution photolithography, directional (anisotropic) plasma etching and other semiconductor technology innovations, such as the use of self-aligning techniques. However, this reduction in device size is putting additional demand on the semiconductor processing technologies and more specifically on the device electrical requirements.

The DRAM chip used in the electronics industry for storing information is one of the circuit types experiencing this demand for increased density. The circuit on the DRAM chip consists in part of an array of individual DRAM storage cells that store binary data (bits) as electrical charge on a storage capacitor. This information is stored or retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor or built over the FET in the cell area as a stacked capacitor. By the year 1998 the number of memory cells (bits) on a DRAM chip is expected to reach about 256 million and by the year 2001 the bit count on the DRAM chip is expected to reach about 1 Gigabits.

With this rapid increase in the number of memory cells on the DRAM chip, and the need to maintain a reasonable chip size with improved circuit performance, the area of the individual cells must be further reduced in size. As the cell size decreases it becomes more difficult to fabricate a stacked capacitor with sufficient capacitance to store the necessary charge to provide an acceptable signal-to-noise level for the read circuit (sense amplifiers) to detect. The reduced charge also necessitates increasing the refresh cycle frequency that periodically restores the charge on these volatile storage cells. Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the pass transistors within each cell area having a vertical extension (third dimension) so as to increase the capacitor area and hence the capacitance.

Many three-dimensional stacked storage capacitor structures have been reported in the literature for increasing the capacitance, but generally require additional processing steps that include additional optical alignment and exposure using photoresist masks. For example, C. Koh in U.S. Pat. No. 5,364,813, teaches a method of forming a fin-shaped like capacitor. The method includes depositing a polysilicon layer on the substrate having a sacrificial borophosphosilicate glass (BPSG) in which the capacitor node contact openings are etched. The bottom capacitor electrodes are then formed by patterning the polysilicon layer using a photoresist mask aligned to the contact. Another capacitor structure is reported by Y. Park et al., U.S. Pat. No. 5,332,685 in which the bit line and storage node contacts are formed by simultaneously forming polysilicon plugs. The bit lines are then formed from a polysilicon or polycide layer by aligning a photoresist mask and patterning the polysilicon layer. Fork-shaped bottom electrodes are then formed over the storage node contacts adjacent to the bit lines which restricts the size of the electrode or limits the minimum size of the cell area. Still another fork-shaped electrode type capacitor is reported by J. Ahn, U.S. Pat. No. 5,386,382 in which the bottom electrode of the capacitor is aligned over a conducting plug in the node contact. A related approach to the current invention is described in the pending patent application Ser. No. 08/549,864 filed on Oct. 30, 1995, now U.S. Pat. No. 5,634,819. In this pending application the stacked capacitor is fabricated by etching contact openings to the capacitor node contact (source/drain) of each pass transistor (FET) by filling contact openings in a thick insulating layer (silicon oxide) with the polysilicon and polishing back the polysilicon, thereby forming polysilicon posts. The thick insulating layer is then partially etched back to expose a portion of the post. An alternate layer of polysilicon, silicon nitride and polysilicon is deposited and anisotropically etched back to form vertical portions (sidewall spacers) for the capacitor bottom electrodes having in cross-sectional view a fork shape. The silicon nitride is selectively removed and a thin interelectrode dielectric layer and polysilicon layer are deposited to complete the array of stacked capacitors.

As the DRAM cell continues to decrease in size it would be desirable to further simplify the process by reducing the number of processing steps while incorporating self-aligning techniques to minimize the ground rule tolerance and improve the cell density. Therefore, there is still a strong need in the semiconductor industry for making a reliable low cost DRAM product using improved processing steps.

SUMMARY OF THE INVENTION

As DRAM cells decrease in size, for example, having linear dimensions less than a micrometer, it is becoming increasingly more difficult to align one photoresist masking level to the next. To avoid this limitation in alignment tolerances, the present invention provides a method for fabricating the bottom electrodes of the storage capacitors with increasing capacitance while using two photoresist masking steps, and a series of self-aligning process steps.

It is therefore a principal object of the present invention to provide an array of dynamic random access memory (DRAM) cells having stacked capacitors with portions of the bottom electrodes extending vertically upward, thereby increasing the capacitance.

It is another object of the present invention to fabricate these stacked capacitors using a two-photoresist masking step and self-aligning techniques for making the capacitor bottom electrodes.

It is still another object of the invention to provide these improved high capacitance stacked capacitors on DRAM cells using a cost effective manufacturing process.

The method for fabricating dynamic random access memory cells having these stacked storage capacitors begins by providing an array of device areas on a semiconductor substrate, such as on a crystal silicon substrate doped with a P-type conductive dopant (e.g., boron). The device areas are provided by forming a relatively thick field oxide surrounding and electrically isolating each device area. One method of forming the field oxide areas is by protecting the device areas from oxidation by depositing and patterning a silicon nitride ($Si_3N_4$) layer and thermally oxidizing the exposed field oxide areas on the silicon substrate. This method is typically referred to in the semiconductor industry as the LOCal Oxidation of Silicon (LOCOS). After removing the silicon nitride layer a thin gate oxide is formed on the silicon substrate in the device areas, and a polycide (polysilicon/silicide) layer having a cap oxide ($SiO_2$) thereon is patterned to form the FET gate electrodes, and interconnecting word lines. Lightly doped source/drain areas are formed adjacent to the gate electrodes, usually by ion implantation of an N-type dopant, such as arsenic (As) or phosphorus (P), and then sidewall spacers are formed, usually by depositing an insulator ($SiO_2$) and anisotropically etching back. The FETs are then completed by using a second N-type dopant implant to form the FET source/drain contact areas. A first insulating layer composed of a silicon oxide layer and a silicon nitride ($Si_3N_4$) layer is deposited. A much thicker second insulating layer composed of chemical vapor deposited (CVD) silicon oxide is deposited and planarized by chemical/mechanical polishing. Alternatively, a borophosphosilicate glass (BPSG) can also be used for the second insulating layer and planarized by thermal annealing.

The stacked capacitors, by the method of this invention, are now fabricated by etching contact openings having essentially vertical sidewalls in the second and first insulating layers to one of the two source/drain contact area of each FET to form the node contact openings for the bottom electrodes of the stacked storage capacitors. A conformal first polysilicon layer, in situ doped with an N-type dopant (e.g., phosphorus) is then deposited thereby filling the node contact openings, and forming a uniformly thick and planar first polysilicon layer elsewhere on the planar second insulating layer.

The first polysilicon layer is now patterned using a single photoresist mask to form the bottom electrodes of the capacitors in which the electrode has a wide base and a vertical center portion. The method involves patterning the photoresist leaving portions over the node contact openings and extending over and defining the desired electrode area. The first polysilicon layer is then partially etched (recessed) to define the outer perimeter of the capacitor bottom electrodes. Next the patterned photoresist layer is isotropically etched (for example using oxygen ashing) to recess the photoresist laterally back from the recess edge in the first polysilicon layer. The remaining polysilicon is now removed in the polysilicon recessed areas to the second insulating layer using an anisotropic plasma etch. This results in a bottom electrode that has a wide base and a relatively thick center portion with vertical sidewalls. The center portion is self-aligned to the edge of the wider base. A conformal third insulating layer, such as $SiO_2$ is deposited over the array of partially completed bottom electrodes and anisotropically plasma etched back to form sidewall spacers on the center portion of the bottom electrode while exposing the top surface of the wide base portion of the electrode. An $N^+$ doped conformal second polysilicon layer is then deposited and also anisotropically etched back to form sidewall portions for the bottom electrodes which contact the perimeter of the wide base and extend vertically upward. This forms a fork shaped electrode, as viewed in cross section, that further increases the capacitor area. The sidewall spacers formed from the third insulating layer and the second insulating layer over the silicon nitride layer, both composed of silicon oxide, are concurrently etched in an isotropic wet etch, such as in a hydrofluoric acid solution, to leave free standing bottom electrodes. The stacked capacitors are now completed by forming a thin interelectrode dielectric layer having a high dielectric constant on the array of bottom electrodes and then depositing and patterning a conductively doped third polysilicon layer to form the top electrode for the capacitors. The interelectrode dielectric can be composed of a silicon oxide-silicon nitride-silicon oxide (ONO) so as to provide a high dielectric layer (silicon nitride) which is essentially pin hole free.

An alternative method is described in a second embodiment for making similar stacked capacitors. In this approach the sidewall spacers are formed from a second insulating layer composed of silicon nitride. This allows one to selectively remove the spacer using, for example, a hot phosphoric acid solution without etching the second insulating layer which is composed of a silicon oxide. This allows the second insulating layer under the bottom electrodes to be independently and partially removed by etching in a hydrofluoric acid solution which better supports the free standing bottom electrodes.

BRIEF DESCRIPTION OF THE DRAWINGS

The objects and advantages of this invention are best understood with reference to the attached drawings in the Figs. and the embodiments which follows.

DESCRIPTION OF THE PREFERRED EMBODIMENT

Now with reference to FIGS. 1 through 11 and in keeping with the objects of this invention a first embodiment is described for making a DRAM cell having these improved stacked capacitors. The DRAM cell is usually formed on a P-doped semiconductor substrate using N-channel field effect transistor (N-FET) structures as the pass transistor in each of the DRAM cells. It should also be well understood by one skilled in the art that by including additional process steps, in addition to those described in this embodiment, other types of devices can also be included on the DRAM chip, for example, by forming N-Well regions in the P doped substrate, P-channel FETs can also be provided from which Complementary Metal-Oxide-Semiconductor (CMOS) circuits can also be formed, such as are used for the peripheral circuits on the DRAM chip.

Figure 1:
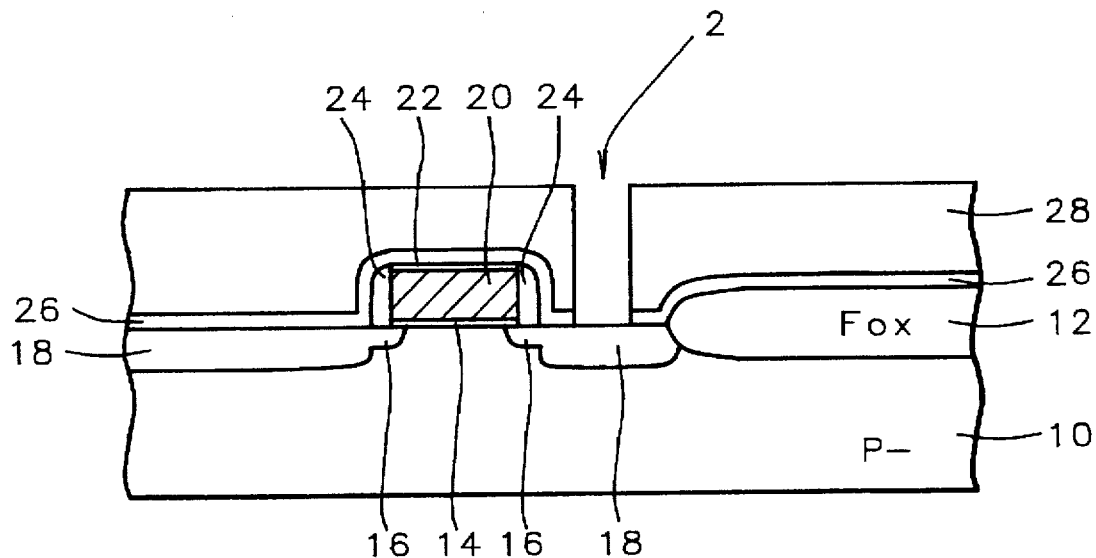
FIGS. 1 through 10 show schematic cross-sectional views for one of the cell regions of an array of DRAM cells illustrating the fabrication steps for the DRAM cell having a stacked storage capacitor with increased capacitance by the method of a first embodiment of this invention.

Referring now to FIG. 1, a schematic cross-sectional view of a portion of a semiconductor substrate 10 is shown having a partially completed DRAM cell with a pass transistor (N-FET) formed on and in the substrate surface. The preferred substrate is composed of a lightly P-type single crystal silicon having preferably a <100> crystallographic orientation. A relatively thick Field OXide (FOX) 12 is formed surrounding and electrically isolating the individual device regions in which the memory cells are built. The field oxide 12, only partially shown in FIG. 1, is most commonly formed by the LOCal Oxidation of Silicon (LOCOS) method. This LOCOS method involves depositing a thin silicon oxide (pad oxide) and a thicker silicon nitride layer as an oxidation barrier layer on the substrate surface (not shown in FIG. 1), and using conventional photolithographic techniques and etching to remove the barrier layer in areas where a field oxide 12 is desired, while retaining the silicon nitride in areas where active devices are to be fabricated. The silicon substrate 10 is then subjected to a thermal oxidation to form the field oxide areas 12. The oxide is usually grown to a thickness in the range of between about 3000 and 6000 Angstroms.

The semiconductor device (N-FET) is now formed in the active device regions after removing the silicon nitride barrier layer and pad oxide in a wet etch. For example, the nitride can be removed in a hot phosphoric acid ($H_3PO_4$) etch at about 180° C., and a pad oxide can be removed in a dilute solution of hydrofluoric acid and water ($HF/H_2O$). The gate oxide for the N-FETs is formed next in the device areas by thermally oxidizing the active device region to form a thin gate oxide 14, as shown in FIG. 1. Typically, the thickness of the gate oxide 14 is between about 50 and 150 Angstroms.

Referring still to FIG. 1, the FET gate electrodes in the device areas and the interconnecting word lines (not depicted in Figs.) are formed next by patterning a polycide layer 20 composed of a polysilicon layer and a silicide layer. Typically a cap oxide layer 22 is deposited on the polycide layer 20 prior to patterning the gate electrodes, as shown in FIG. 1. Conventional photolithographic techniques and anisotropic plasma etching are used to pattern the electrodes. The polycide layer 20 is typically formed by depositing a polysilicon layer using, for example, low pressure chemical vapor deposition (LPCVD), and a reactant gas, such as silane ($SiH_4$). The polysilicon layer is then doped with an N-type conductive dopant, for example, by ion implantation with arsenic ions ($As^{75}$) or phosphorus ions ($p^{31}$). Typically the polysilicon layer is between about 2000 and 4000 Angstroms thick, and is doped to a concentration of between about $1.0 E 19$ to $1.0 E 21$ atoms/cm$^3$. The refractory metal silicide layer such as tungsten silicide ($WSi_2$), is formed on the polysilicon layer by physically depositing a tungsten (W) metal and then sintering to form the silicide or alternatively, the tungsten can be formed by chemical vapor deposition (CVD) using tungsten hexafluoride ($WF_6$) as the reactant gas. The silicide serves to reduce the electrical resistance in the interconnecting word lines and improve circuit performance. Typically, the $WSi_2$ is about 500 to 2000 Angstroms thick. The cap oxide 22, usually composed of silicon oxide ($SiO_2$) is also deposited using LPCVD by decomposing a reactant gas, such a tetraethosiloxane (TEOS), and is provided over the silicide to electrically insulate the gate electrodes from the bit lines that are later formed. Typically, the thickness of the cap oxide layer 22 is between about 800 and 1600 Angstroms.

Lightly doped source/drain areas 16 are formed next adjacent to the gate electrode 20. The lightly doped source and drain areas for the N-FETs are formed by ion implantation of an N-type dopant, such as arsenic or phosphorus. For example, a typical implant might consist of phosphorus $p^{31}$ at a dose of between 1 E 13 to 10 E 13 atoms/cm$^2$ and an energy of between about 30 and 80 KeV. The gate electrodes serve as an implant mask to self-align the source/drain areas to the electrode, while an additional photoresist mask can be used to avoid Unwanted implants elsewhere on the substrate.

After forming the lightly doped source/drain 16, sidewall spacers 24 are formed on the sidewalls of the gate electrode 20, also shown in FIG. 1. These sidewall spacers 24 are typically formed by depositing a low temperature conformal silicon oxide, and then anisotropically etched back to the silicon surface. For example, the sidewall oxide can be deposited using LPCVD using the reactant gas tetraethoxysilane (TEOS) at a temperature in the range of about 650 and 900° C. and the etch back performed in a low pressure reactive ion etcher. An $N^+$ source/drain ion implantation is then used to complete the source/drain areas forming the $N^+$ doped source/drain contact areas 18 aligned to the sidewall spacers 24 and therefore also aligned to the lightly doped source/drain areas 16, as depicted in FIG. 1.

Still referring to FIG. 1, a first insulating layer 26 is deposited. Preferably layer 26 is a multilayer composed of a silicon oxide ($SiO_2$) layer having a silicon nitride ($Si_3N_4$) layer on the $SiO_2$. The silicon oxide layer is preferably deposited by LPCVD using a reactant gas such as tetraethosiloxane (TEOS) and the silicon nitride is deposited also using LPCVD and a reactant gas mixture such as dichlorosilane ($SiCl_2H_2$) and ammonia ($NH_3$). The silicon oxide layer is preferably between about 500 and 1200 Angstroms thick and the silicon nitride layer is between about 500 and 1200 Angstroms thick.

The remainder of this embodiment addresses more specifically the method of fabricating the array of improved stacked storage capacitors on the DRAM device. In accordance with the objects of this invention, two masking steps are used to form the bottom capacitor electrode (capacitor node electrode). One masking step is used to form the node contact openings for the stacked storage capacitors to the second of the two source/drain contact areas of each FET in the DRAM cells. Then a second masking step and etching and a series of deposition steps and etch back steps are used to complete the bottom electrodes for the stacked storage capacitors that are self-aligned to a patterned first polysilicon layer formed from a second masking step aligned over the node contact openings.

Still referring to FIG. 1, a relatively thick second insulating layer 28 is deposited on the substrate 10 over the first insulating layer 26 and then is planarized. One preferred method for forming an essentially planar insulating layer is to deposit a second insulating layer 28 having a low glass transition temperature and annealing at a temperature greater than the glass transition temperature to level the layer. For example, one preferred insulating layer is a borophosphosilicate glass (BPSG) which can be deposited by LPCVD using a reactant gas mixture of silane ($SiH_4$) and oxygen ($O_2$) or alternatively, by the decomposition of tetraethosiloxane (TEOS) while in situ doping the silicon oxide using a dopant gas such as phosphine ($PH_3$) an diborane ($B_2H_6$). The preferred thickness of layer 28 is between about 4000 and 10000 Angstroms, and is annealed at a temperature of about 850 to 950° C. for about 10 to 30 minutes to achieve an essentially planar surface. Alternatively, layer 28 can be planarized by chemical/mechanical polishing (CMP). Conventional photolithographic techniques and anisotropic etching are next used to etch the node contact openings 2 in the insulating layers 28 and 26 to source/drain contact areas 18 chosen for the capacitor node contacts, such as area 18 shown in FIG. 1. The anisotropic etching is preferably done in a low pressure plasma etcher or reactive ion etcher (RIE) using an etch gas or gas mixture that is anisotropic (directional) in silicon oxide and further has a high etch rate selectively of silicon oxide to silicon. For example, one preferred etch gas is trifluoromethane ($CHF_3$) or alternatively, a gas mixture of carbon tetrafluoride ($CF_4$) and hydrogen ($H_2$) can be used, and either gas mixture can be combined with a carrier gas, such as argon (Ar) or helium (He). As can also be seen in FIG. 1, the node contact opening 2 has an essentially vertical sidewall in the BPSG glass.

Figure 2:
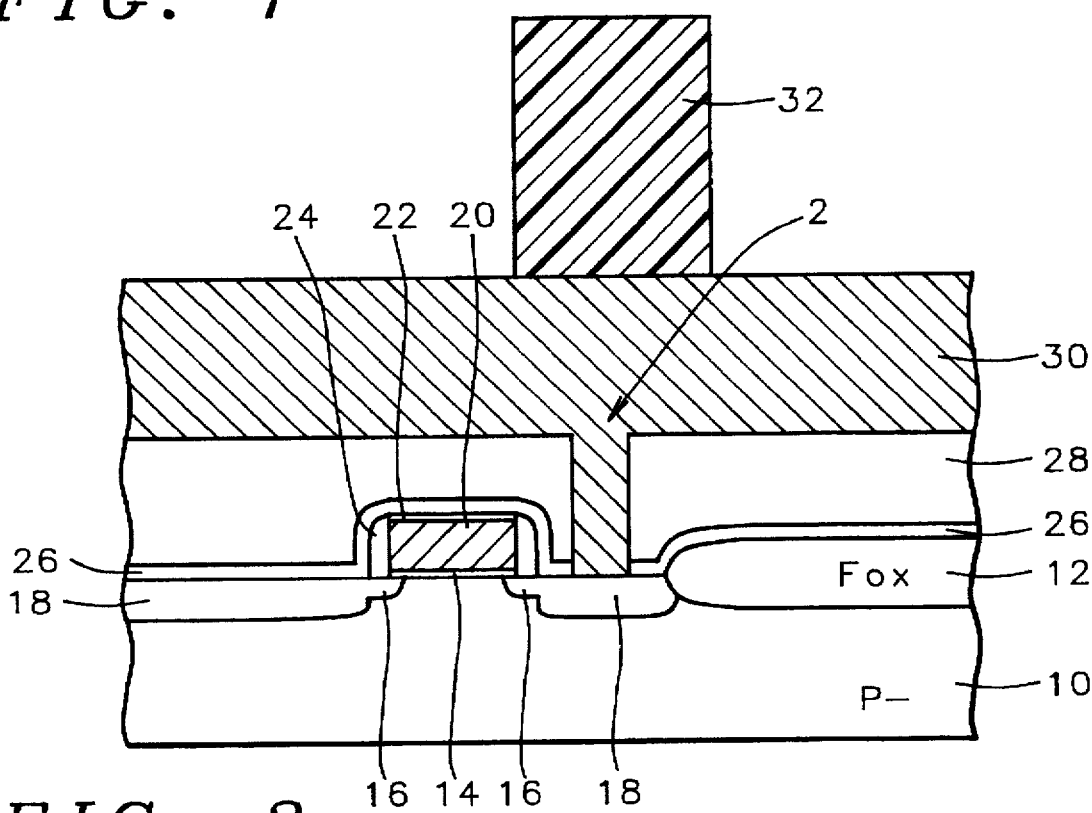

Referring now to FIG. 2, a blanket conformal first polysilicon layer 30 is now deposited on the planarized second insulating layer 28 sufficiently thick to completely fill the contact openings, as depicted for opening 2 in FIG. 1. The polysilicon layer 30 is preferably deposited by low pressure chemical vapor deposition (LPCVD) using silane ($SiH_4$), and is in-situ doped by adding a dopant gas, such as phosphine or arsine ($AsH_3$) to the silane. The preferred thickness of polysilicon layer 30 is between about 4000 and 8000 Angstroms having a dopant concentration of between about 5.0 E 19 and 1.0 E 21 atoms/$cm^3$. The conformal layer 30 is deposited to a thickness sufficient to form a planar surface on the planarized second insulating layer 28 over the node contact openings, as also depicted in FIG. 2. Continuing, conventional photolithographic techniques are used to form a patterned photoresist mask 32 over the array of contact openings (such as contact opening 2 in FIG. 2). The perimeter of the patterned photoresist mask 32 defines the outer perimeter of the bottom electrodes for the stacked capacitors that are now fabricated.

Figure 3:
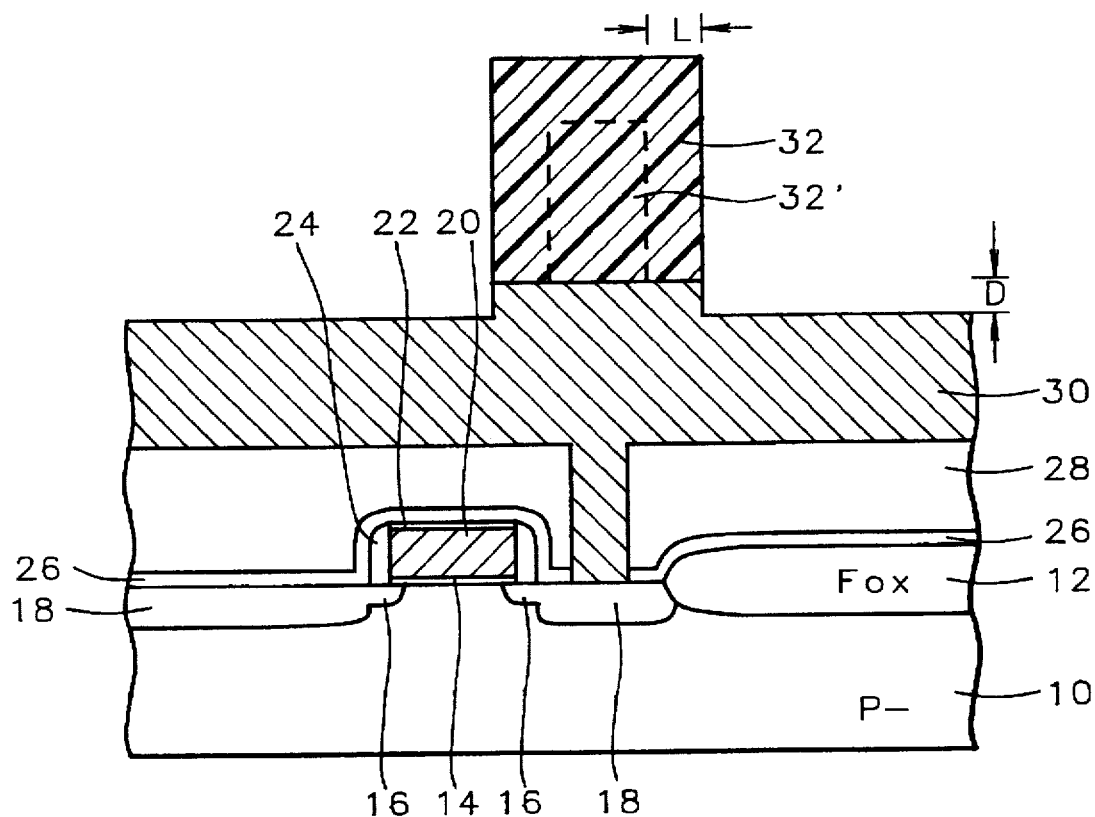

Referring to FIG. 3, anisotropic plasma etching is used to remove a portion of the polysilicon layer 30 thereby partially recessing layer 30. Preferably, the recess D is between about 1000 and 2000 Angstroms, and is achieved by etching at low pressure in a high plasma density etcher or reactive ion etcher using an etching gas mixture such as sulfur hexafluoride ($SF_6$) and oxygen ($O_2$) or chlorine ($Cl_2$) and hydrogen bromide (HBr).

Referring now to FIG. 3, an important feature of the invention is the isotropic plasma etching of the patterned photoresist layer 32 to partially remove and thereby laterally recess the patterned photoresist by a distance L. Preferably the recess distance L is between about 500 and 1500 Angstroms, and is achieved by plasma ashing using an oxygen ambient. The remaining portion of the patterned photoresist 32' is also depicted in FIG. 3 by the broken line.

Figure 4:
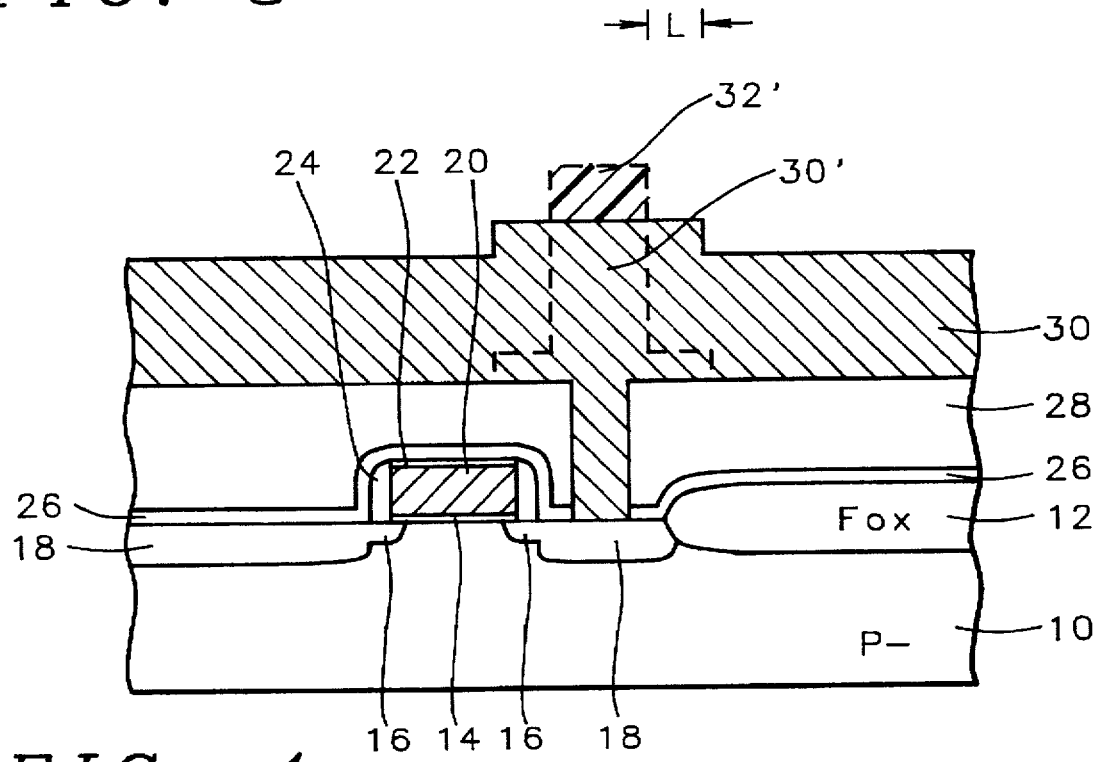

Referring now to FIG. 4, the first polysilicon layer 30 is anisotropically etched back selectively to the surface of the second insulating layer 28 composed of the CVD silicon oxide or BPSG. For example, a low pressure plasma etch can be used, such as reactive ion etching (RIE) using a reactive etch gas mixture containing a chlorine ($Cl_2$) species and a carrier gas, such as argon (Ar). This etch back results in the partially completed portions of the bottom electrodes 30', the shape of which is depicted by the broken line in FIG. 4. Now important to the method of this invention, since the remaining patterned photoresist layer 32' by virtue of isotropic etch (ashing) is self-aligned to the perimeter of the recess in layer 30 the resultant portion 30' has vertically centered portions self-aligned to the perimeter of a lower base portion of layer 30'.

Figure 5:
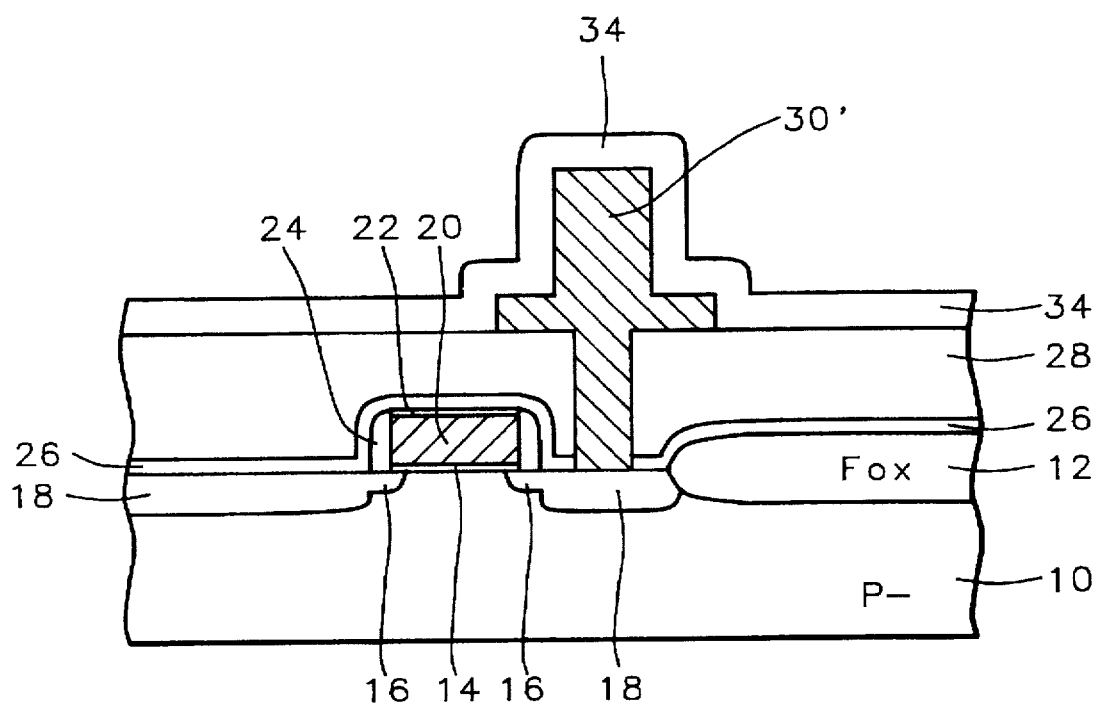

Referring now to FIG. 5, after removing the remaining portions of the photoresist layer 32' (FIG. 4), a conformal third insulating layer 34 is deposited, preferably composed of silicon oxide ($SiO_2$). For example, layer 34 can be deposited by low pressure chemical vapor deposition (LPCVD) using a reactant gas such TEOS. The thickness of the silicon oxide layer 34 is preferably between about 800 and 2500 Angstroms.

Figure 6:
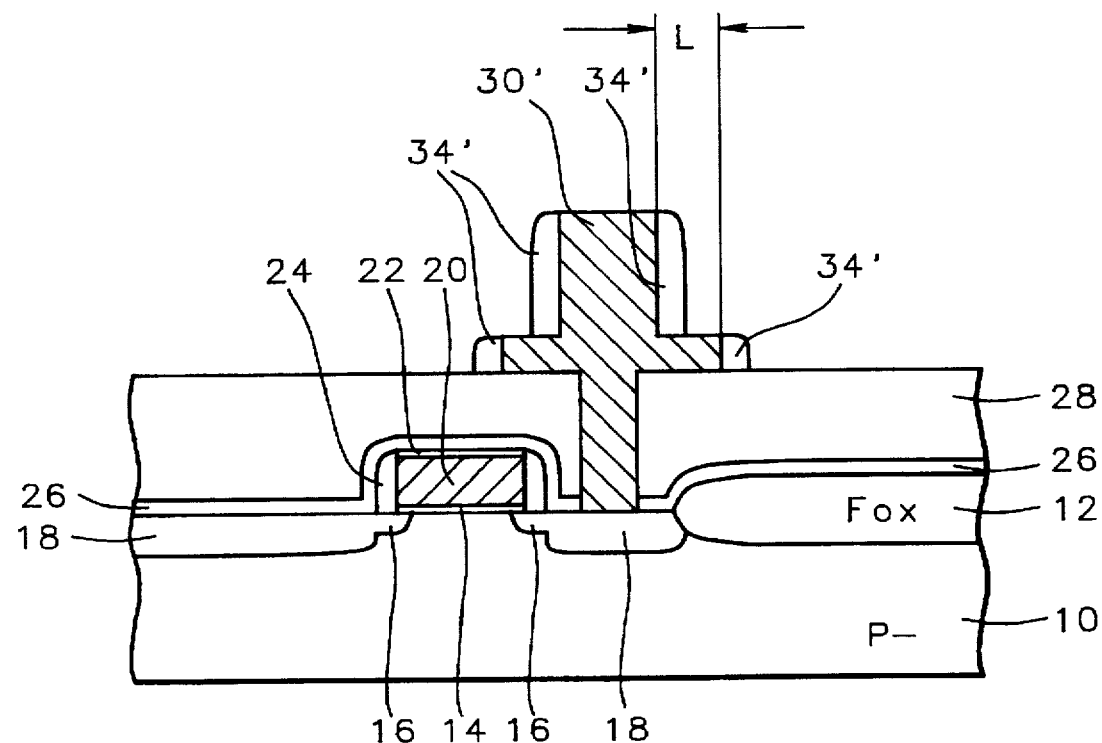

Now as shown in FIG. 6, the conformal oxide layer 34 is anisotropically etched back to the surface of the layers 30' and 28 thereby forming the sidewall spacers 34'on the sidewalls of the center portion of the patterned polysilicon layer 30' and on the sidewalls of the wider base portion of the partially completed bottom electrode. For example, the etch back can be achieved using a low pressure high plasma density etch or by RIE using an etchant gas mixture such as carbon tetrafluoride ($CF_4$). The thickness of sidewall spacers 34' is chosen to be less than the recess length L. As will soon be apparent, this allows the formation of polysilicon sidewalls that further increase the surface area of the bottom electrodes.

Figure 7:
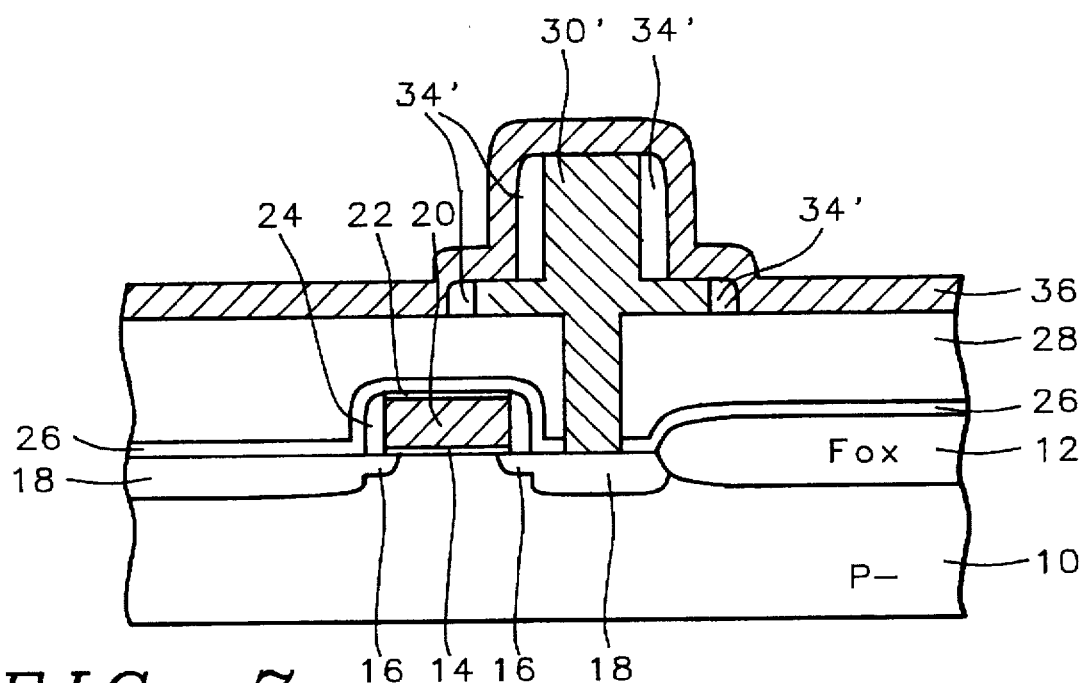

Referring next to FIG. 7, a second conformal polysilicon layer 36 is deposited. Preferably layer 36 is deposited by LPCVD, for example using a reactant gas such as silane ($SiH_4$), and is doped in-situ by adding a dopant gas, such as phosphine ($PH_4$) during the deposition. Polysilicon layer 36 is preferably doped to a concentration of between about 1.0 E 19 and 1.0 E 21 atoms/$cm^3$, and the preferred thickness of layer 36 is between about 800 and 2500 Angstroms.

Figure 8:
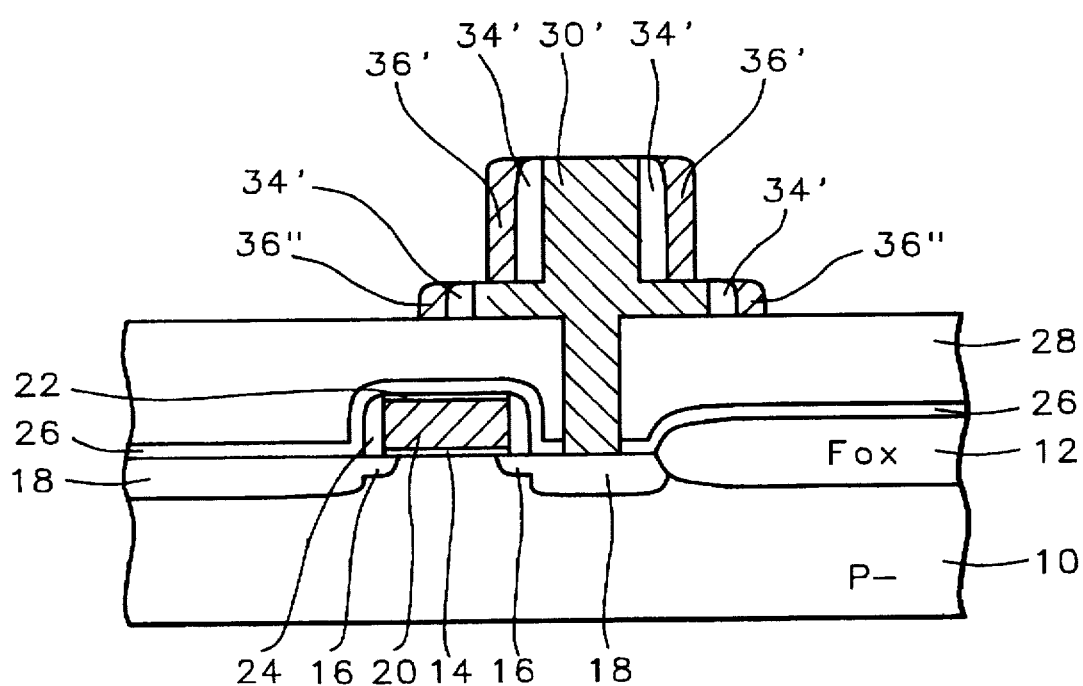

Now as shown in FIG. 8, the polysilicon layer 36 is blanket etched back to form the sidewall portions 36'electrically contacting the wide base portion of the bottom electrodes made of polysilicon layer 30'. Also formed are small sidewall portions 36", as depicted in FIG. 8, which are later removed from the final capacitor structures.

Figure 9:
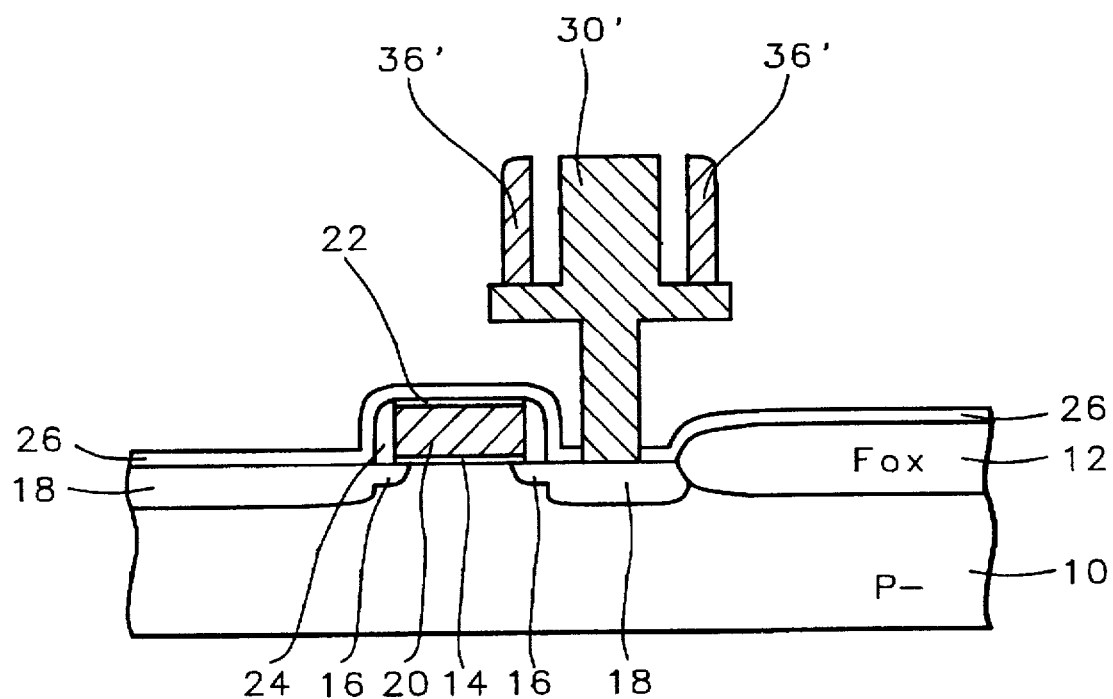

Referring now to FIG. 9, the array of bottom electrodes having a fork-shape profile are completed by concurrently removing the sidewall spacers 34' and the second insulating layer 28 leaving free standing bottom electrodes composed of patterned portions of layers 30' and 36'. The oxide layers 34' and 28 are preferably removed using a wet etch. For example, layers 34' and 28 can be removed in a solution of hydrofluoric acid (HF) which leaves essentially unetched the silicon nitride layer making up the top portion of the multilayer 26.

Figure 10:
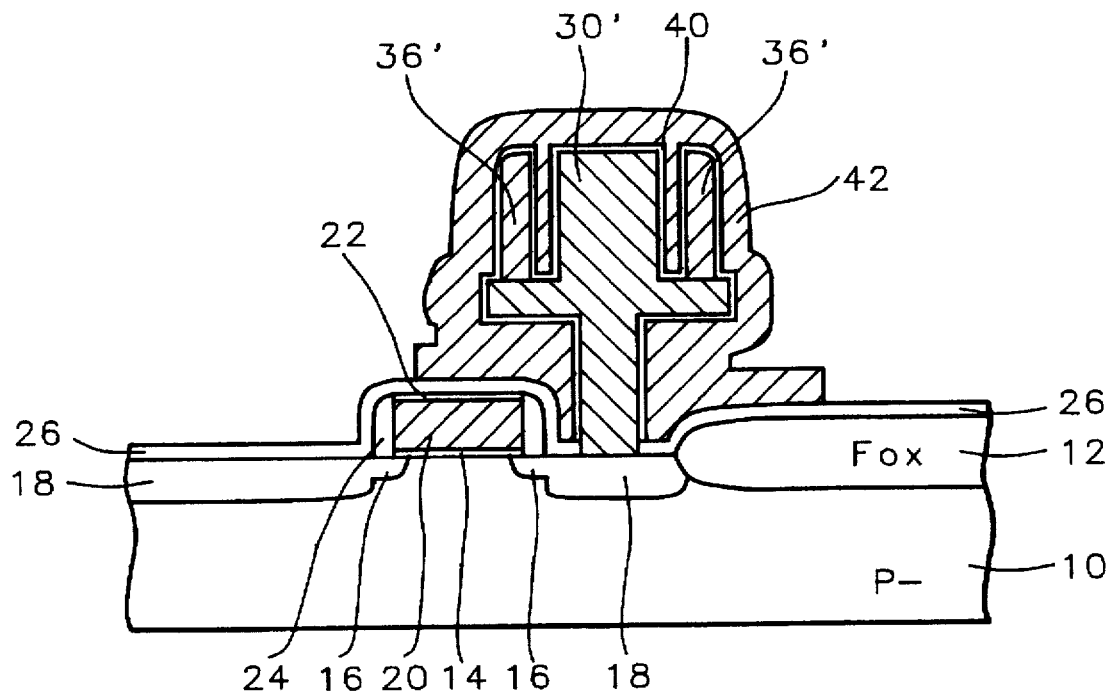

Referring now to FIG. 10 the stacked capacitors are completed by forming a capacitor interelectrode dielectric layer 40 on the surface of the capacitor bottom electrodes composed of layers 30' and 36. The dielectric layer 40 is preferably composed of silicon nitride and silicon oxide ($Si_3N_4/SiO_2$) or layers of silicon oxide, silicon nitride and silicon oxide (ONO). For example, the dielectric layer 40 can be formed by depositing a silicon nitride layer using low pressure chemical vapor deposition (LPCVD) and a reactive gas mixture of ammonia ($NH_3$) and dichlorosilane ($SiH_2Cl_2$) followed by oxidation of the silicon nitride layer in a wet oxygen at a temperature of about 850° C. for about 10 minutes. The preferred total thickness of the interelectrode dielectric layer 40 is between about 10 and 100 Angstroms. In addition, other commonly practiced methods can be used to further increase the capacitance, such as roughing the electrode surface and by using interelectrode materials having higher dielectric constants, such as tantalum pentoxide ($Ta_2O_5$). A third polysilicon layer 42 is deposited on the interelectrode dielectric layer 40. Layer 42 conformally covers the bottom electrode and forms the top electrode for the storage capacitors. Layer 42 is preferably deposited by LPCVD and is in-situ doped N-type. The preferred thickness of polysilicon layer 42 is between about 1000 and 2000 Angstroms and is doped with an N-type dopant impurity, such as with phosphorus (P). The preferred concentration of phosphorus in layer 42 is in the range of between about 5.0 E 19 and 1.0 E 21 atoms/$cm^3$. The polysilicon layer 42 is then patterned using conventional photolithographic techniques and plasma etching to form the top electrodes and complete the array of fork-shaped stacked capacitors, only one of which is depicted in FIG. 10.

Figure 11:
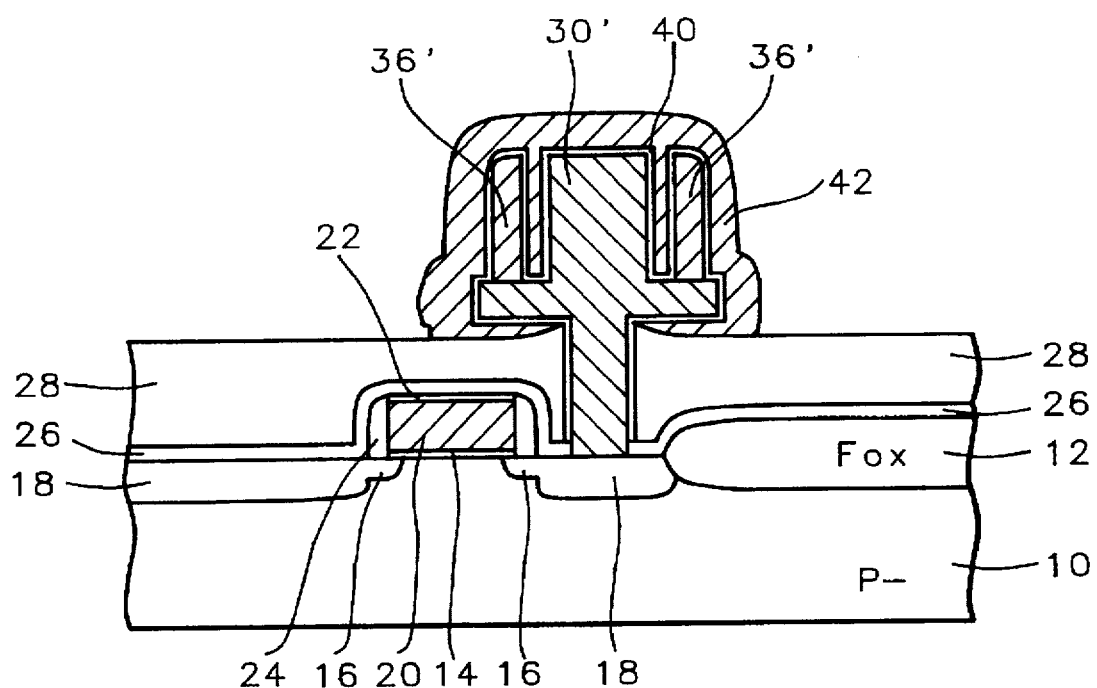
FIG. 11 shows a schematic cross-sectional view for one of the completed cell regions of an array of DRAM cells by the method of the second embodiment in which a portion of a second insulating layer is retained to provide added structural support for the free-standing capacitor bottom electrode.

Referring now more specifically to FIG. 11 a DRAM cell with a completed stacked capacitor by the method of the second embodiment is shown. The structural elements are similar and therefore similarly numbered. The method is similar to the first embodiment with a few minor changes and therefore the layers are labeled the same for the structures shown in the Figs. for the first embodiment. In the second embodiment the silicon oxide layer 34 (FIG. 5 in the first embodiment) is replaced by a silicon nitride ($Si_3N_4$) layer, and therefore the sidewall spacers 34' in FIG. 6 are also composed of $Si_3N_4$. The preferred thickness of the silicon nitride layer is also between about 800 and 2500 Angstroms. Preferably the new $Si_3N_4$ layer 34' is deposited using LPCVD and a reactant gas similar to the deposition of the silicon nitride layer used in the multilayer 26. Now this allows the sidewall spacers 34' (FIG. 8) to be selectively removed while leaving essentially the supporting silicon oxide layer unetched. For example, the $Si_3N_4$ can be removed using a hot phosphoric acid solution. Then, as shown in FIG. 11, the oxide layer 28 can be partially removed to provide additional structural support for the stacked capacitor while reducing only minimally the capacitor area. For example, a time isotropic etch can be carried out in a HF solution or HF vapor etch. The array of stacked capacitors is then completed as in the first embodiment by forming an interelectrode dielectric layer on the bottom electrode and depositing and patterning an $N^+$ doped third polysilicon layer similar to forming the top capacitor electrodes in the first embodiment.

While the invention has been particularly shown and described with reference to the preferred embodiments thereof, it will be understood by those skilled in the art that various changes in form and details may be made without departing from the spirit and scope of the invention.

What is claimed is:

1. A method for fabricating stacked storage capacitors on a semiconductor substrate, comprising the steps of:

providing a semiconductor substrate having device areas surrounded and electrically isolated from each other by field oxide areas, said device areas having semiconductor devices formed, in part, from a patterned polycide layer, and having contact areas in said device areas, said substrate coated with a first insulating layer and further forming said stacked storage capacitors by;

depositing a second insulating layer on said substrate and over said first insulating layer;

planarizing said second insulating layer;

photoresist masking and anisotropically etching node contact openings having essentially vertical sidewalls in said second and first insulating layers to said device contact areas for said stacked capacitors;

depositing a conformal first polysilicon layer, and thereby filling said node contact openings, and forming a uniformly thick and planar first polysilicon layer elsewhere on said planar second insulating layer;

forming a patterned photoresist mask on portions of said first polysilicon layer over said node contact openings where bottom electrodes for said stacked capacitors are required while leaving exposed other areas of said first polysilicon layer;

anisotropically plasma etching and partially recessing said first polysilicon layer;

isotropically etching said patterned photoresist mask and thereby laterally recessing said patterned photoresist mask;

anisotropically plasma etching said first polysilicon layer to said second insulating layer in said first polysilicon recesses, thereby forming portions of said bottom electrodes having a wide base and vertical center portions with vertical sidewalls self-aligned to said base edge;

removing the remaining portion of said photoresist mask;

depositing a conformal third insulating layer;

anisotropically plasma etching back said third insulating layer thereby forming sidewall spacers on said portions of said bottom electrodes;

depositing a conformal second polysilicon layer;

anisotropically plasma etching back said second polysilicon layer and thereby forming sidewall portions on said bottom electrode contacting said wide base region;

removing said third insulating sidewall spacers and said second insulating layer concurrently by isotropically wet etching, thereby forming fork-shaped bottom electrodes;

forming a interelectrode dielectric layer on said bottom electrodes;

depositing a third polysilicon layer;

patterning said third polysilicon layer and thereby completing said stacked storage capacitors.

2. The method of claim 1, wherein said polycide layer is composed of an $N^+$ doped polysilicon layer having a tungsten silicide ($WSi_2$) on the surface.

3. The method of claim 1, wherein said first insulating layer is a multilayer composed of a bottom silicon oxide ($SiO_2$) layer having a thickness of between about 500 and 1200 Angstroms, and a top silicon nitride ($Si_3N_4$) layer having a thickness of between about 500 and 1200 Angstroms.

4. The method of claim 1, wherein said second insulating layer is composed of borophosphosilicate glass (BPSG) having a thickness of between about 4000 and 10000 Angstroms and is made planar by thermal annealing.

5. The method of claim 1, wherein said second insulating layer is composed of a chemical vapor deposited silicon oxide and is made planar by chemical/mechanical polishing.

6. The method of claim 1, wherein said first polysilicon layer is between about 4000 and 8000 Angstroms thick and doped with phosphorus (P) having a concentration of between about 5.0 E 19 to 1.0 E 21 atoms/cm$^3$.

7. The method of claim 1, wherein said partial recessing of said first polysilicon layer is to a depth of between about 1000 and 2000 Angstroms.

8. The method of claim 1, wherein said lateral recessing of said patterned photoresist mask is between about 500 and 1500 Angstroms.

9. The method of claim 1, wherein the thickness of said third insulating layer, composed of silicon oxide, is between about 800 and 2500 Angstroms.

10. The method of claim 1, wherein said interelectrode dielectric layer is composed of a silicon oxide-silicon nitride-silicon oxide (ONO) and is between about 10 and 100 Angstroms thick.

11. The method of claim 1, wherein said third polysilicon layer is $N^+$ doped and is between about 1000 and 2000 Angstroms thick.

12. A method for fabricating stacked storage capacitors on a semiconductor substrate, comprising the steps of:

providing a semiconductor substrate having device areas surrounded and electrically isolated from each other by field oxide areas, said device areas having semiconductor devices formed, in part, from a patterned polycide layer, and having contact areas in said device areas, said substrate coated with a first insulating layer and further forming said stacked storage capacitors by;

depositing a second insulating layer on said substrate and over said first insulating layer;

planarizing said second insulating layer;

photoresist masking and anisotropically etching node contact openings having essentially vertical sidewalls in said second and first insulating layer to said device contact areas for said stacked capacitors;

depositing a conformal first polysilicon layer, and thereby filling said node contact openings, and forming a uniformly thick and planar first polysilicon layer elsewhere on said planar second insulating layer;

forming a patterned photoresist mask on portions of said first polysilicon layer over said node contact openings where bottom electrodes for said stacked capacitors are required while leaving exposed other areas of said first polysilicon layer;

anisotropically plasma etching and partially recessing said first polysilicon layer;

isotropically etching said patterned photoresist mask and thereby laterally recessing said patterned photoresist mask;

anisotropically plasma etching said first polysilicon layer to said second insulating layer in said first polysilicon recesses, thereby forming portions of said bottom electrodes having a wide base and vertical center portions with vertical sidewalls self-aligned to said base edge;

removing the remaining portion of said photoresist mask;

depositing a conformal third insulating layer composed of silicon nitride;

anisotropically plasma etching back said third insulating layer thereby forming sidewall spacers on said portions of said bottom electrodes;

depositing a conformal second polysilicon layer;

anisotropically plasma etching back said second polysilicon layer and thereby forming sidewall portions on said bottom electrode contacting said wide base region;

removing said third insulating sidewall spacers by wet etching in hot phosphoric acid;

partially removing said second insulating layer by isotropically wet etching in a solution of hydrofluoric acid, thereby forming fork-shaped bottom electrodes;

forming a interelectrode dielectric layer on said bottom electrodes;

depositing a third polysilicon layer;

patterning said third polysilicon layer and thereby completing said stacked storage capacitors.

13. The method of claim 12, wherein said polycide layer is composed of an $N^+$ doped polysilicon layer having a tungsten silicide ($WSi_2$) on the surface.

14. The method of claim 12, wherein said first insulating layer is a multilayer composed of a bottom silicon oxide ($SiO_2$) layer having a thickness of between about 500 and 1200 Angstroms, and a top silicon nitride ($Si_3N_4$) layer having a thickness of between about 500 and 1200 Angstroms.

15. The method of claim 12, wherein said second insulating layer is composed of borophosphosilicate glass (BPSG) having a thickness of between about 4000 and 10000 Angstroms and is made planar by thermal annealing.

16. The method of claim 12, wherein said second insulating layer is composed of a chemical vapor deposited silicon oxide and is made planar by chemical/mechanical polishing.

17. The method of claim 12, wherein said first polysilicon layer is between about 4000 and 8000 Angstroms thick and doped with phosphorus (P) having a concentration of between about 5.0 E 19 to 1.0 E 21 atoms/cm$^3$.

18. The method of claim 12, wherein said partial recessing of said first polysilicon layer is to a depth of between about 1000 and 2000 Angstroms.

19. The method of claim 12, wherein said lateral recessing of said patterned photoresist mask is between about 500 and 1500 Angstroms.

20. The method of claim 12, wherein the thickness of said third insulating layer is between about 800 and 2500 Angstroms.

21. The method of claim 12, wherein said interelectrode dielectric layer is composed of a silicon oxide-silicon nitride-silicon oxide (ONO) and is between about 10 and 100 Angstroms thick.

22. The method of claim 12, wherein said third polysilicon layer is $N^+$ doped and is between about 1000 and 2000 Angstroms thick.

* * * * *